(12) United States Patent
Brittain

(10) Patent No.: US 6,891,374 B2
(45) Date of Patent: May 10, 2005

(54) MOVING TABLE MRI WITH FREQUENCY-ENCODING IN THE Z-DIRECTION

(75) Inventor: Jean Helen Brittain, Menlo Park, CA (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 10/749,167

(22) Filed: Dec. 30, 2003

(65) Prior Publication Data

US 2004/0155654 A1 Aug. 12, 2004

Related U.S. Application Data

(63) Continuation of application No. 09/682,699, filed on Oct. 5, 2001, now Pat. No. 6,794,869, which is a continuation-in-part of application No. 09/681,420, filed on Mar. 30, 2001, now Pat. No. 6,801,034.

(51) Int. Cl.[7] .......................... G01V 3/00; A61B 5/055
(52) U.S. Cl. ...................... 324/309; 324/318; 324/307; 600/410; 600/415
(58) Field of Search ............................... 324/300–322; 600/420, 410, 415

(56) References Cited

U.S. PATENT DOCUMENTS

| | | | | |
|---|---|---|---|---|
| 5,928,148 A | * | 7/1999 | Wang et al. ................ 600/420 |
| 6,385,478 B1 | * | 5/2002 | Hajnal ........................ 600/410 |
| 6,445,181 B1 | * | 9/2002 | Pelc et al. .................. 324/307 |
| 6,584,337 B2 | * | 6/2003 | Dumoulin et al. .......... 600/410 |
| 6,617,850 B2 | * | 9/2003 | Welch et al. ................ 324/309 |
| 2002/0021128 A1 | * | 2/2002 | Kuhara ....................... 324/309 |
| 2002/0115929 A1 | * | 8/2002 | Machida .................... 600/410 |
| 2002/0140423 A1 | * | 10/2002 | Brittain ..................... 324/301 |
| 2002/0173715 A1 | * | 11/2002 | Kruger et al. .............. 600/410 |
| 2003/0011369 A1 | * | 1/2003 | Brittain et al. ............. 324/309 |
| 2003/0100825 A1 | * | 5/2003 | Demoulin et al. .......... 600/410 |
| 2003/0102864 A1 | * | 6/2003 | Welch et al. ................ 324/307 |
| 2004/0155654 A1 | * | 8/2004 | Brittain ..................... 324/309 |

FOREIGN PATENT DOCUMENTS

| | | |
|---|---|---|
| JP | H6-304153 A | 11/1994 |
| JP | H6-311977 A | 11/1994 |
| JP | H8-173396 A | 7/1996 |

OTHER PUBLICATIONS

Dietrich et al., article "Extending the coverage of true volume scans by continuous movement of the subject" by Olaf Dietrich and Joseph V. Hajnal from The Robert Steiner Magnetic Resonance Unit, Hammersmith Hospital, Du Cane Road, London W120HS 1999.*

Yoshitome Japanese Laid–open Patent Application (kokai) No. H6–304153 disclosed Nov. 1st 1994.*

Yoshitome Japanese Laid–open Patent Application (kokai) No. H6–311977 disclosed Nov. 8th 1994.*

(Continued)

Primary Examiner—G. Bradley Bennett
Assistant Examiner—Tiffany A. Fetzner
(74) Attorney, Agent, or Firm—Ziolkowski Patent Solutions Group, LLC; Michael A. Della Panna; Carl B. Horton

(57) ABSTRACT

A system and method are disclosed using continuous table motion while acquiring data to reconstruct MR images across a large FOV without significant slab-boundary artifacts that reduces acquisition time. At each table position, full z-encoding data are acquired for a subset of the transverse k-space data. The table is moved through a number of positions over the desired FOV and MR data are acquired over the plurality of table positions. Since full z-data are acquired for each slab, the data can be Fourier transformed in z, interpolated, sorted, and aligned to match anatomic z locations. The fully sampled and aligned data is then Fourier transformed in remaining dimension(s) to reconstruct the final image that is free of slab-boundary artifacts.

20 Claims, 10 Drawing Sheets

OTHER PUBLICATIONS

US Provisional Appl. No. 60/282,555, filed Apr. 9, 2001.

J. Pipe, *Analysis of Localized Quadratic Encoding and Reconstruction*, MRM 36:137–146 (1996).

K. Liu et al., *Applications of Shifted–Interleaved Multi–Volume Acquisition (SIMVA) with Suppressed Slab Boundary Artifact*, ISMRM Seventh Scientific Meeting, p. 1618 (1999).

K. Liu et al., *Artifact Transformation Technique: Shifted Interleaved Multi–Volume Acquisition (SIMVA) for 3D FSE*, ISMRM Sixth Scientific Meeting, p. 572 (1998).

O. Dietrich et al., *Extending the Coverage of True Volume Scans by Continuous Movement of the Subject*, ISMRM Seventh Scientific Meeting, p. 1653 (1999).

K.Y. Ho et al., *Gadolinium Optimized Tracking Technique: A New MRA Technique for Imaging the Peripheral Vascular Tree from Aorta to the Foot Using One Bolus of Gadolinium*, ISMRM Fifth Scientific Meeting, p. 203 (1997).

J. Hennig, *Overlapping Section Coverage in Multisection Imaging*, JMRI 3:425–432 (1993).

K. Liu et al., *Sliding Interleaved $k_y$ (SLINKY) Acquisition: A Novel 3D MRA Technique with Suppressed Slab Boundary Artifact*, JMRI 8:903–911 (1998).

K. Liu, *SLINKY: More Understanding, Optimization and Application for High Resolution MRA*, ISMRM Seventh Scientific Meeting, p. 1908 (1999).

J. Pipe, *Spatial Encoding and Reconstruction in MRI with Quadratic Phase Profiles*, MRM 33:24–33 (1995).

K. Liu et al., *Systematic Assessment and Evaluation of Sliding Interleaved $k_y$ (SLINKY) Acquisition for 3D MRA*, JMRI 8:912–923 (1998).

\* cited by examiner

MOVING TABLE MRI WITH FREQUENCY-ENCODING IN THE Z-DIRECTION

CROSS-REFERENCE TO RELATED APPLICATIONS

The present application is a continuation of U.S. patent application Ser. No. 09/682,699 filed Oct. 5, 2001, now U.S. Pat. No. 6,794,869 which is a continuation-in-part of U.S. patent application Ser. No. 09/681,420 filed Mar. 30, 2001 now U.S. Pat. No. 6,801,034.

BACKGROUND OF THE INVENTION

The present invention relates generally to an improved method of medical imaging over large areas, and more particularly, to a method and apparatus of acquiring magnetic resonance (MR) images over an area that is greater than the optimal imaging area of an MR scanner using continuous table movement through the MR scanner without incurring slab-boundary artifacts.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal B, is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

In such MRI systems, the volume for acquiring MR data with optimal gradient linearity, having a uniform magnetic field $B_o$, and uniform radio frequency (RF) homogeneity is of limited extent. Desired fields-of-view (FOV) that exceed this limited volume are traditionally acquired in sections, with table motion between scans. The resulting concatenated images often exhibit discontinuities at the slab junctions. These slab-boundary artifacts result in non-ideal images. When these artifacts are either severe or occur in a critical region-of-interest, complete re-acquisition of data may be needed for a thorough analysis. In addition, the time for table motion extends scan time beyond that required for data acquisition.

Known methods designed to eliminate slab boundary artifacts in angiograms and 3D fast spin echo acquisitions include Sliding Interleaved $k_y$ Acquisition (SLINKY) and Shifted Interleaved Multi-Volume Acquisition (SIMVA). These methods however, move the slab-selective excitation while keeping the table stationary rather than moving the table and keeping the slab position stationary. As a result, these methods are limited by the inherent optimal imaging volume of the MR scanner. These methods employ phase encoding in the z-direction and do not account for those situations where the z matrix is not equal to the number of $k_x$-$k_y$ subsets. Similarly, other known methods designed to eliminate slab boundary artifacts have likewise moved the imaging slab rather than the patient table. Other known techniques implement a continuously moving table in both the phase encoding and frequency direction. However, prior techniques that move the patient table in the frequency-encode direction encode the data as if they were acquiring an image of the entire FOV and data is combined prior to any Fourier transform.

Other known systems employ stepped table and/or moving table approach with an array of receiver coils that move with the imaged object. Data is collected from each coil independently as it moves through the homogeneous volume of the scanner. None of these known systems however, collect data from a slab thickness that is fixed relative to the magnet, place the frequency encoding axis in the direction of table motion, and combine the data after Fourier transforming in the direction of table motion.

It would therefore be desirable to have a new method and apparatus that allows coverage of large FOV without slab-boundary artifacts in the resulting concatenated images.

BRIEF DESCRIPTION OF THE INVENTION

The present invention relates to a system and method of acquiring large FOV MR images using continuous table motion for increased volume coverage that results in reconstructed images without discontinuities.

Slab-boundary artifacts are eliminated and scan time is reduced in an acquisition sequence by continuously moving an imaging object with respect to the optimal volume of the imaging apparatus, or vice versa. The thickness of the slab, which is smaller than the desired FOV, is selected to remain within the optimal volume of the MR system. The selected slab position remains fixed relative to the magnet of the MR scanner during the scan, and the table is moved continuously during scanning of the entire FOV. MR data is acquired by applying an excitation that excites spins and applying magnetic field gradient waveforms to encode the volume of interest. The volume of interest is restricted in the direction of table motion. The magnetic field gradients traverse k-space following a trajectory that is uniform in the k-space dimension that is in the direction of table motion. The magnetic field gradient waveforms that encode the k-space directions perpendicular to table motion are divided into subsets. During each acquisition, all the k-space data in the direction of table motion are acquired for a subset of at least one other k-space dimension. After acquisition, data is transformed in the direction of table motion, sorted, and aligned to match anatomical locations in the direction of table motion. This procedure is repeated to fill the entire matrix. A final image is reconstructed by transforming the data in the remaining dimension(s) perpendicular to table motion. This approach provides reconstructed images absent of slab-boundary artifacts over a large FOV and reduces the time needed for image acquisition.

In accordance with one aspect of the invention, a method of imaging large volumes without resulting slab-boundary artifacts includes defining a desired FOV larger than an optimal imaging volume of an MR scanner and selecting a slab thickness in a first direction that is smaller than the desired FOV but that is within the optimal imaging volume of the MR scanner. MR data is then acquired by exciting and encoding spins to acquire data that is restricted to the selected slab thickness. The imaging object is then moved continuously with respect to the imaging area, or vice versa. This process is repeated until the desired FOV is fully encoded using a series of cyclically repeated magnetic field gradient waveforms. The selected trajectory need only be uniform in the direction of motion.

In accordance with another aspect of the invention, an MRI apparatus is disclosed to acquire multiple sets of MR data with a moving table and reconstruct MR images without slab-boundary artifacts that includes a magnetic resonance imaging system having an RF transceiver system and a plurality of gradient coils positioned about a bore of a magnet to impress a polarizing magnetic field. An RF switch is controlled by a pulse module to transmit and receive RF signals to and from an RF coil assembly to acquire MR data A patient table is moveable fore and aft in the MR system about the magnetic bore to translate the patient so that an FOV larger than the optimal scanning area of the MRI system can be scanned. A computer is programmed to receive input defining a desired FOV larger than the optimal imaging volume of the MR system. The computer is also capable of defining a fixed slab with respect to the magnet to acquire the MR data therein. The computer then acquires full MR data using frequency encoding in the direction of table motion for a subset of the data in the direction(s) perpendicular to table motion while repositioning the patient table and maintaining the position of the fixed slab. The algorithm is repeated, collecting the necessary MR data across the defined FOV. The patient table can be tracked using the acquired MR data. To reconstruct the image, the MR data is first transformed in the direction of table motion, and then interpolated and aligned to match anatomic locations across slab boundaries. Thereafter, the MR data is transformed with respect to the remaining dimension(s) to reconstruct an MR image.

Yet another aspect of the invention includes a computer program having a set of instructions executed by a computer to control a medical imaging scanner and create large FOV images without significant boundary artifacts. The computer is caused to select an FOV spanning an area greater than a predefined optimal image area of the medical imaging scanner, apply an RF pulse to excite a region of interest, and apply magnetic field gradients to encode the region of interest in a first direction. The volume of interest is limited in the direction of table motion by acquiring the data in such a way that an acquisition filter can be used to restrict the spatial extent. Image data can then be acquired in the first direction as a subset of remaining direction(s) for each acquisition. The computer causes a patient table to move continually with respect to the medical imaging scanner, and repeat the image data acquisition with encoding in the first direction for the encoding in remaining direction(s) until sufficient data is acquired across the entire FOV. An image can be reconstructed without slab-boundary artifacts after aligning anatomical data in the first direction.

Various other features, objects and advantages of the present invention will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figure 1:
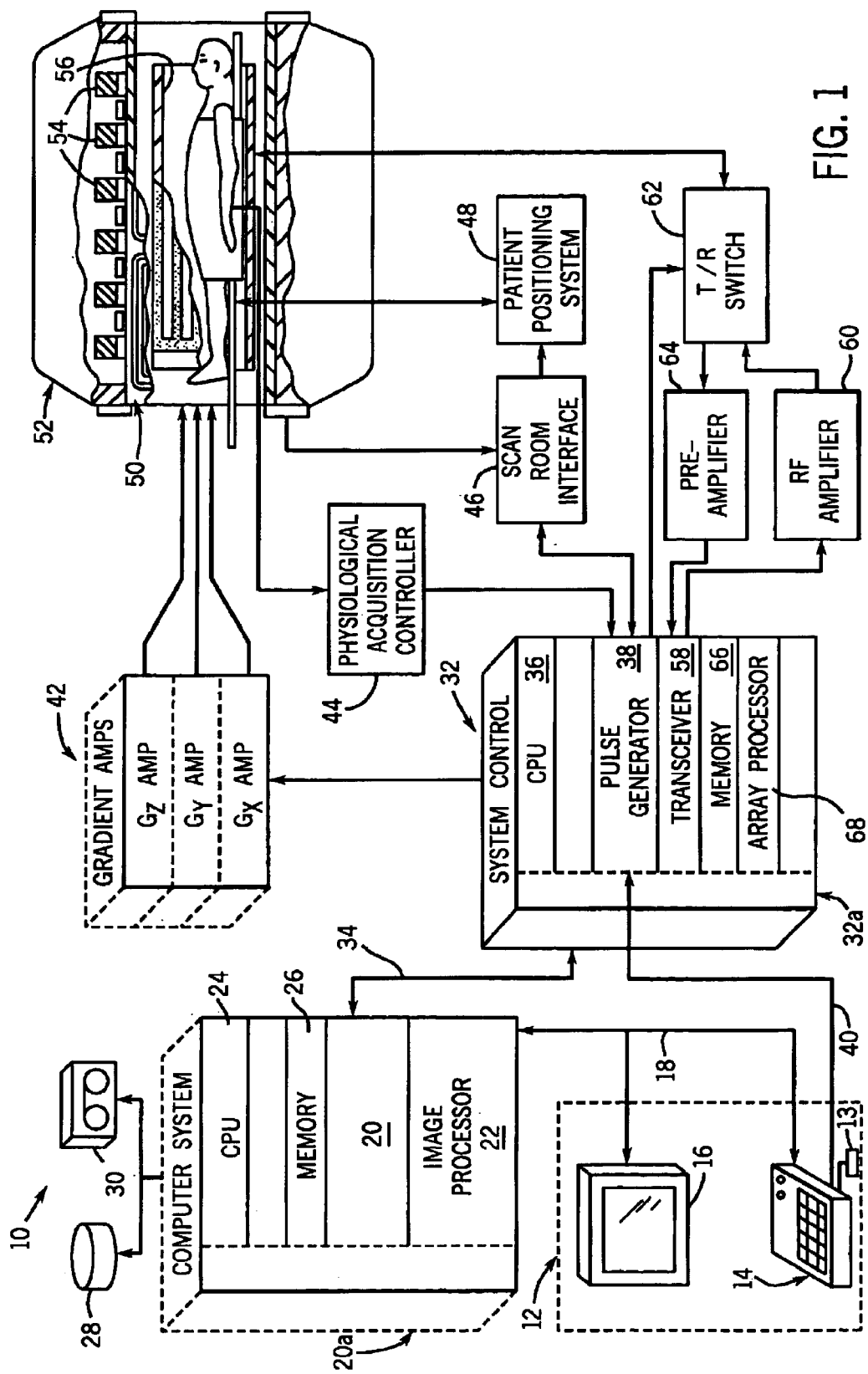
FIG. 1 is a schematic block diagram of an MR imaging system for use with the invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is processed as necessary and rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30 or any mass storage device, or it may be further processed by the image processor 22 and conveyed to the operator console 12 and presented on the display 16.

The present invention includes a method and system suitable for use with the above-referenced MRI system, or any similar or equivalent system for obtaining MR images. When used with a trajectory that is uniform in the direction of table motion, such as z, data acquired in sections can be reconstructed to form large FOV images without significant slab-boundary artifacts.

As is known, in any MRI system, there is a limited spatial volume having optimal gradient linearity, uniform magnetic polarizing field $B_0$ and uniform RF homogeneity. Larger volumes are traditionally imaged in sections with table motion between scans that result in concatenated images that exhibit discontinuities at slab junctions.

One embodiment to generate large FOV images without slab-boundary artifacts includes a 3D imaging technique that steps the table position in increments during the scanning procedure. In general, after defining the desired FOV, a slab thickness is selected to remain within the MRI system's optimal imaging volume. As a result, the slab thickness is also smaller than the desired spatial coverage. MR data is acquired by repeatedly applying an excitation that excites spins and applying magnetic field gradient waveforms to encode the volume of interest. Preferably, a z slab selective RF pulse is used to excite the volume of interest in the z-direction and a 3D k-space trajectory encodes the volume selected. Some example of 3D k-space trajectories include a 3D EPI k-space trajectory, a cylindrical-stack of EPI k-space trajectory, a stack-of-spirals k-space trajectory, a stack-of-TWIRL k-space trajectory, a stack-of-projection-reconstruction k-space trajectory, and a 3DFT k-space trajectory. More generally though, the spatial extent of the acquired data is restricted in the direction of motion using a method such as using a slab-selective RF pulse or by using an acquisition strategy that allows the acquisition filter to restrict the volume of interest. Therefore, in the examples shown and in a preferred embodiment, the direction of table motion is in the z-direction. However, as one skilled in the art will readily recognize, the x-y-z orientation is arbitrary and the invention is not so limited. In addition, in the example shown and in a preferred embodiment the table moves relative to the system. However, as one skilled in the art will readily recognize it is equivalent to have the system move relative to the subject and the invention is not so limited.

The table is moved to cover the desired FOV while the slab position remains fixed relative to the magnet in the MRI system. At each table position, full k-space data in the direction of table motion is acquired for a subset of the data in the other two dimension(s) by using one or a series of magnetic field gradient waveforms. In this embodiment, at each table position, full k, data is acquired for a subset of $k_x$-$k_y$ by using one or a series of magnetic field gradient waveforms. Preferably, RF excitations and magnetic field gradient waveforms are continued during table motion to preserve a steady-state condition.

Figure 2:
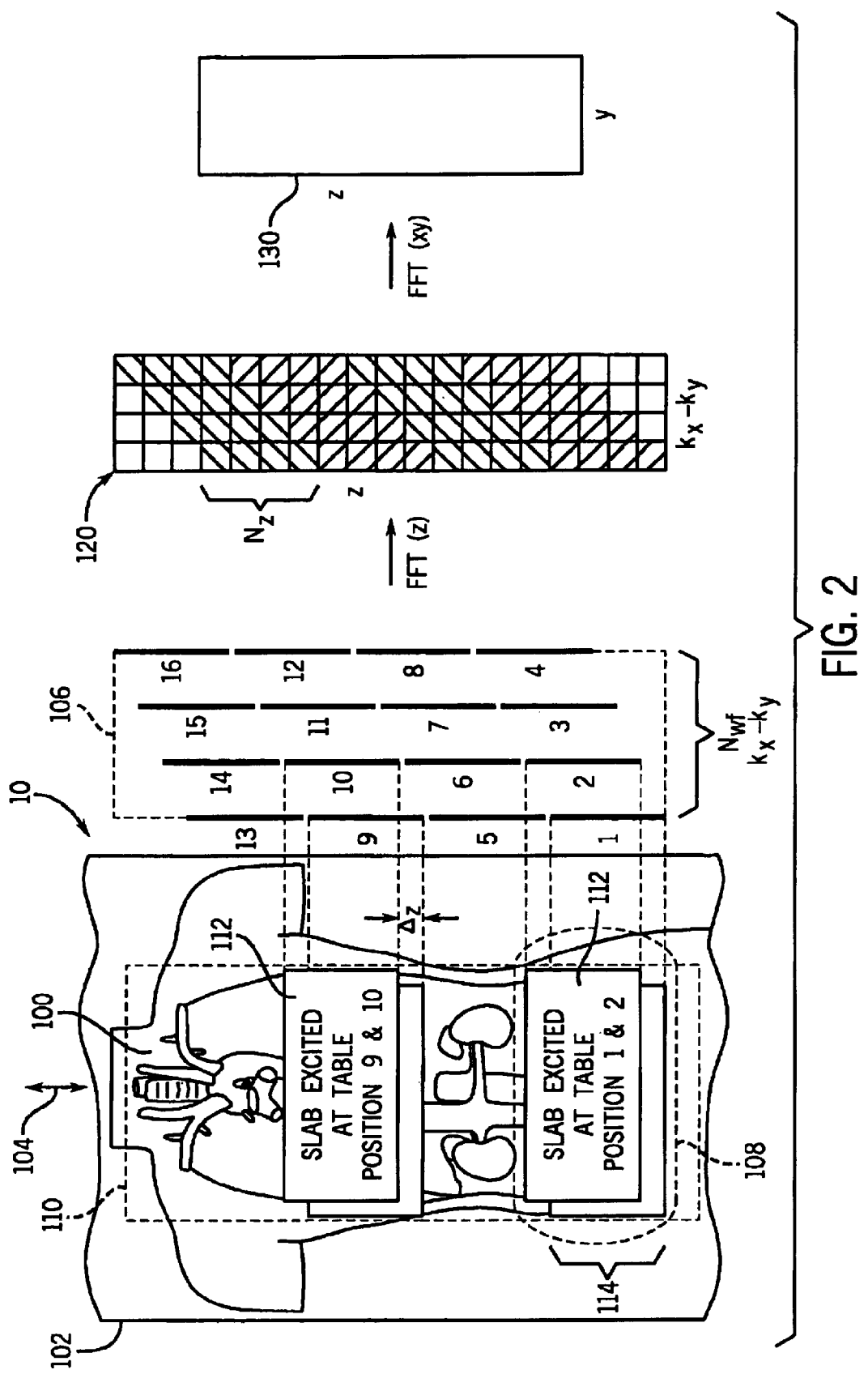
FIG. 2 is a diagram illustrating one embodiment of a data acquisition technique in accordance with the invention.

Referring to FIG. 2, a data acquisition and processing technique, in accordance with one embodiment of the invention, is shown schematically. FIG. 2 illustrates one embodiment of the invention for acquiring data. In this embodiment, the table is stepwise incremented 15 times with data acquisitions 106 in 16 table positions along the desired FOV. Each of the table increments are of equal distance $\Delta_z$. A patient 100 is positioned on a moveable table 102, which moves fore and aft 104 within the MRI scanner 10 with respect to the magnet and the optimal imaging area 108 of the MRI scanner. The desired FOV 110 is substantially larger than the optimal imaging area 108, which is generally larger than a selected slab thickness 112. As previously discussed, the table motion in this simplified example is in the z direction. Magnetic field gradient waveforms are designed to encode four $k_x$-$k_y$ subsets ($N_{wf}$=4) with a total of 16 table positions and data acquisition sets 106. At each table position 1–16, there are four data acquisitions encoding four $k_z$ levels that result in four z-pixels in the excited slab after Fourier transformation in the z direction ($N_z$=4). $N_z$ and the retained slab thickness may be reduced slightly after acquisition if edge slices are dropped from each z-$k_x$-$k_y$ data set to minimize the effect of imperfections in the slab profile. It is understood that the optimal imaging area 108 is defined by the physical characteristics of the MRI system 10. It is preferred to define a volume of interest, or slab, 112 to be within the optimal imaging area 108.

It is noted that when $N_z$=$N_{wf}$, each of the table increments throughout the desired FOV 110 are of equal distance. Accordingly, any of the aforementioned parameters can be adjusted as desired. That is, the slab thickness 114 may be made larger or smaller, or the number of table positions and data acquisition sets 106 can be increased or decreased, above or below the 16 that are shown. The minimum number of table positions desired to reconstruct an image is equal to the number of waveform subsets, $N_{wf}$. Additionally, the number of z-pixels, $N_z$, retained in each excited slab, as well as the number of $k_x$-$k_y$ subsets can be modified as desired. Preferably however, $N_z$ is kept greater than or equal to $N_{wf}$. One such modification will be described with reference to FIG. 3.

Still referring to FIG. 2, it is noted that each table position 1–16, includes complete sampling in the direction of table motion which in this case is the z-direction, for a subset of the $k_x$-$k_y$ data, or more generally, in the directions perpendicular to the direction of table motion. Accordingly, either after all the data at each table position is acquired, or after all the data is acquired for a complete image, the data is Fourier transformed in the direction of table motion, in this case in the z direction, FFT(z), to form an array of z-$k_x$-$k_y$ data 120. The patient table 102 is moved in steps until the entire FOV 110 is covered. As indicated, at each table position, full z-encoding data, or encoding data in the direction of table motion, is acquired for a subset of the $k_x$-$k_y$ data, which are the two directions perpendicular to the table motion. While no data is acquired while the table is moving, it is desirable to continue the RF excitations and magnetic field gradient waveforms to preserve the steady-state condition.

After Fourier transforming with respect to z, or the direction of table motion, data acquired at different table positions are then sorted, interpolated as required, and aligned to match anatomic z locations, thereby filling the z-$k_x$-$k_y$ space. In general, the table step distances are multiples of the z-resolution and are selected to ensure complete sampling of the z-$k_x$-$k_y$ matrix. As previously indicated, after the acquired data are Fourier transformed with respect to z, data at the slab edges can be dropped as required by imperfections in the slab-select profile. A final reconstructed image 130 is formed by gridding, if necessary, and Fourier transforming the fully sampled data array 120 with respect to x and y.

For complete sampling, the number of z-pixels retained, $N_{wf}$ must be at least equal to the number of $k_x$-$k_y$ waveform subsets, $N_{wf}$. However, referring to FIG. 3, which also illustrates a simple example assuming table motion in the z direction, increasing the slab thickness 132 while maintaining the z resolution results in an increase in the number of z-pixels, $N_z$, that are encoded at each table position. In this example, $N_z$=8 for 4 $k_x$-$k_y$ subsets ($N_{wf}$=4). Because $N_z$ is greater than $N_{wf}$, the table increments are not all equal, as shown in FIG. 2. That is, the distance between table positions 1, 2, 3, and 4, is less than that between table positions 4 and table position 5. Therefore, using a thicker slab, fewer movements of the table are required for the same spatial coverage. This results in an overall faster acquisition for the same size FOV, as compared to that in FIG. 2, if the time to initiate table motion is long relative to the time for a single acquisition. Even though increasing the slab thickness, $N_z$, incrementally increases individual acquisition time for each slab, the total scan time decreases because the time to initiate table motion dominates. Thus, in the case when the time to initiate table motion is long relative to the time for a single acquisition, scan time is minimized by minimizing the number of table movements. With current equipment, it typically takes approximately one second to initiate table motion. While reducing this time is the long-term desired solution, it is not practical in the short term since it requires significant changes to the system architecture.

Figure 3:
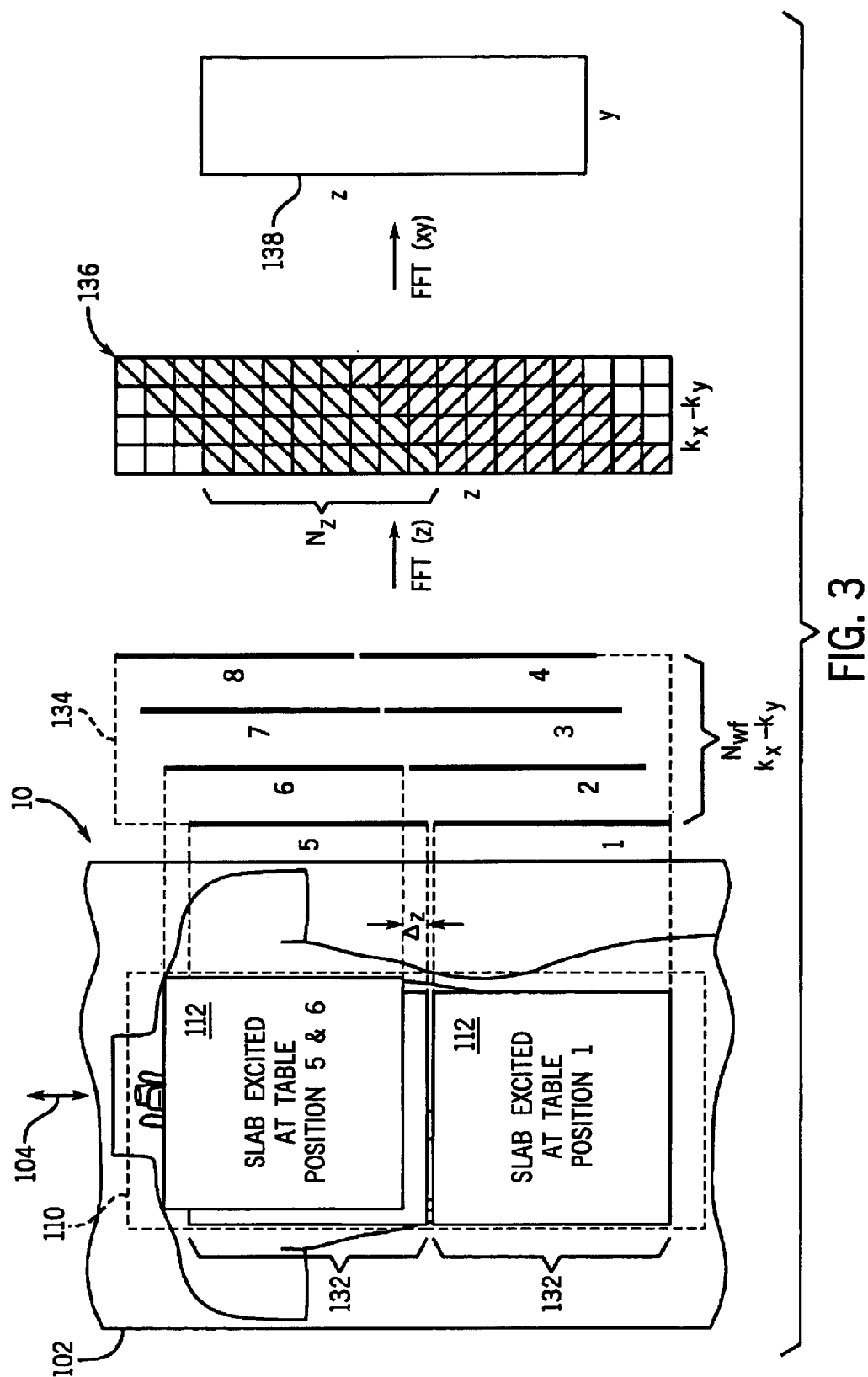
FIG. 3 is a diagram similar to FIG. 2, illustrating another embodiment for data acquisition in accordance with the invention.

Still referring to FIG. 3, after step-wise translating the patient table through the entire FOV 110 and acquiring data set 134, the data is Fourier transformed with respect to z to obtain a z-$k_x$-$k_y$ data set 136. The data acquired at different table positions can then be sorted and aligned to match anatomic z locations. A final image 138 is reconstructed by again first gridding, if necessary, and then Fourier transforming the fully sampled data with respect to x and y, FFT (xy).

To generalize, the table step distances are multiples of the pixel size in the direction of table motion and are selected to ensure complete sampling of the 3D matrix. The number of table steps required depends on the relative number of pixels retained in the excited slab, $N_z$, for the case of motion in the z direction, and the number of magnetic field gradient waveform subsets required to fully encode the dimension(s) perpendicular to table motion, $N_{wf}$. As previously indicated, for complete sampling, $N_z$, should be at least equal to $N_{wf}$. However, if $N_z$ is greater than $N_{wf}$, faster overall scan times are achievable. It is noted that the subsets of magnetic field gradient waveforms, ($g_x$, $g_y$) are defined by one or a series of such waveforms that differ between subsets. This set, or series, of magnetic field gradient waveforms, that encode the $k_x$, $k_y$ subsets, are then repeated in a cyclic manner to obtain the data sets 106, FIG. 2, and 134, FIG. 3.

The present technique can be used with any 3D k-space trajectory that is uniform in the direction of table motion. In one embodiment implemented on a system with table motion in the z direction, a cylindrical stack of EPI trajectory (CSEPI) sequence was utilized that phase encodes in $k_z$ between planes of interleaved EPI waveforms that are clipped to a circle in $k_x$-$k_y$. The data is gridded before Fourier transformation in x and y. The waveforms were designed with $G_{max}$=22 mT/m and a slew rate of 120 mT/m/ms. Since k-space data for a single anatomic location is being compiled from data collected at different table positions, any variation in phase or amplitude in the direction of table motion will result in image artifacts. To minimize such artifacts, one embodiment uses a linear phase slab-select RF pulse with sharp transitions and low in-slice ripple, for example 0.5%, and drops one slice at each slab edge. Frequency variations in the direction of table motion that result from magnetic field inhomogeneity are demodulated during reconstruction. Further, decreasing the slab thickness also decreases the sensitivity to such variations.

Figure 4:
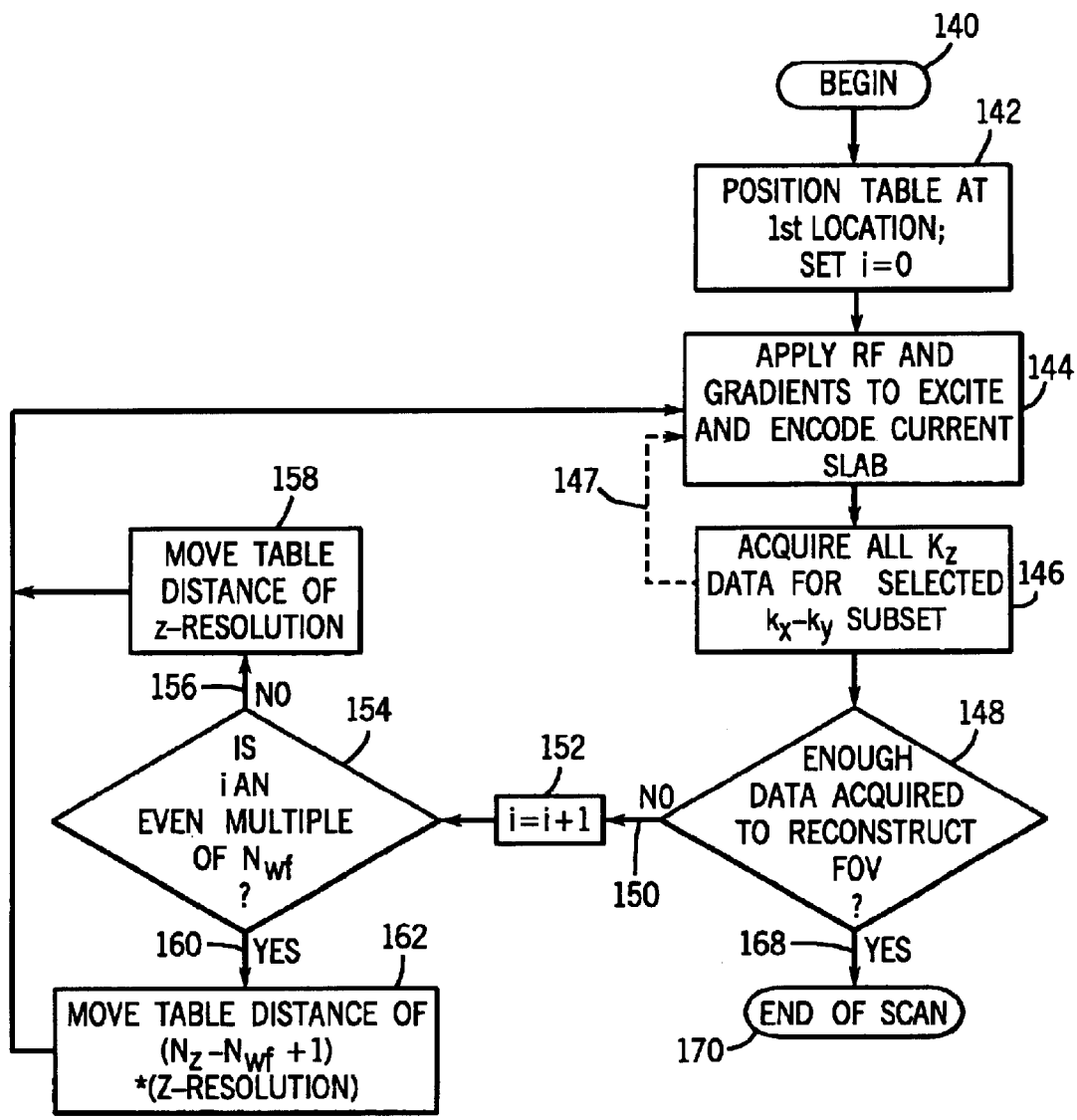
FIG. 4 is a flow chart demonstrating a data acquisition algorithm for use with that shown in FIGS. 2 and 3.

FIG. 4 is a flow chart for a data acquisition sequence in accordance with the techniques of FIGS. 2 and 3. After the data acquisition sequence is initialized 140, the table is positioned at the first location and a variable i is initialized 142. MR data is acquired by repeatedly exciting spins using an RF pulse and applying magnetic field gradient waveforms to encode the volume of interest 144. Assuming table motion in the z-direction, all $k_z$ data are acquired for the selected $k_x$-$k_y$ subset, that are in the dimension(s) perpendicular to table motion 146. The spatial extent in the direction of table motion is restricted using a restriction method such as either a slab-selective RF excitation or by acquiring data in such a way that the acquisition filter can be used to restrict the slab thickness. It is noted that for phase encoding in the direction of table motion the RF pulse is repeatedly applied prior to each acquisition 147 until all $k_z$ data is acquired 146. For readout in the direction of table motion, each RF pulse is applied at 144 followed by acquisition of complete $k_z$ data for the selected $k_x$-$k_y$ subset 146. As long as the end of the FOV is not reached 148, 150, the variable i is incremented 152 and the system checks whether a complete set of magnetic gradient field waveform subsets has been acquired 154. That is, as long as the variable i is not an even multiple of $N_{wf}$ 154, 156, the table is moved a distance equal to the resolution in the direction of table motion 158, and the next slab becomes the current slab at 144 and data is again acquired at 146. After a complete series of subsets have been acquired 154, 160, the system determines if the next table increment is in accordance to that described with reference to FIG. 2 or FIG. 3. That is, if the number of magnetic gradient field waveforms is equal to the number of pixels retained in the slab in the direction of table motion ($N_{wf}=N_z$), the table is moved a distance equal to the z-resolution, or in the direction of table motion 162, as in FIG. 2, and the data acquisition sequence continues 144, 146. Otherwise, where $N_z$ is greater than $N_{wf}$ 162, such as in FIG. 3, the table is moved a distance according to:

$$(N_z-N_{wf}+1)\times(\text{z-resolution}), \qquad \text{Eqn. 1.}$$

and data is again acquired for the new slab 144, 146, until all the slabs have been scanned across the FOV 148, 168 which completes the scan at 170. Again, the direction of table motion is arbitrarily chosen and represented as a z-direction. However, the invention is not so limited. As one will readily recognize, the assignment of any character set can be used to represent a three dimensional axis.

It is noted that at each table position such as the acquisition at table position 1 in FIGS. 2 and 3, unique magnetic gradient waveforms or a set of waveforms on the gradient axes perpendicular to the direction of table motion (transverse waveforms) are applied in conjunction with the gradient waveform or waveforms required to acquire a complete set of data in the direction of table motion. At table positions 2, 3, and 4, different magnetic gradient field waveforms or sets of waveforms are applied on the axes perpendicular to the direction of table motion. The next series of table positions, 5–8, FIGS. 2 and 3, use the same magnetic field gradient waveforms as in the data acquisitions 1–4. Therefore, the variable i is used to also increment the application of the proper magnetic field gradient waveforms for the series, and when a series is complete, the same waveforms are recycled in the next series.

Figure 5:
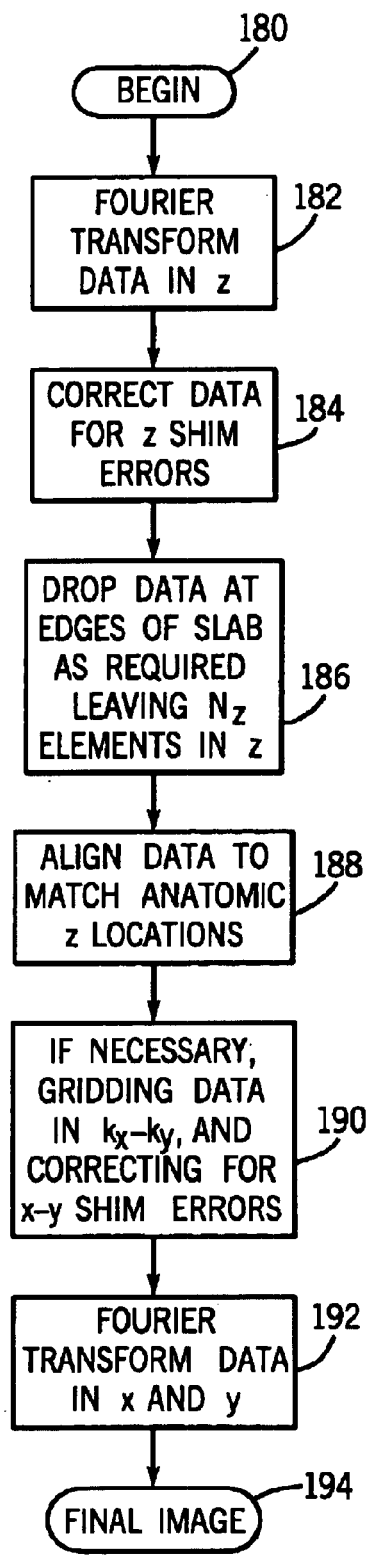
FIG. 5 is a flow chart showing the data processing steps employed either during or after the data acquisition of FIG. 4.

Referring now to FIG. 5, a data processing scheme in accordance with the present invention is shown in flow chart form. Once initiated 180, which can either be as data is being acquired on-the-fly, or after all data has been acquired, the MR data is Fourier transformed in the direction of table motion, z in this case, at 182, and if necessary, the data is corrected for shim errors in that direction 184. After Fourier transformation, the data at the edge boundaries of the slab are discarded as required 186, which results in N, data elements in the direction of table motion. The data is then aligned to match anatomic locations at 188 and then, if necessary, the data may be gridded and corrected for shim errors in the remaining two directions at 190. The data is then Fourier transformed in the transverse dimension(s) at 192 to reconstruct the final image 194.

Figure 6:
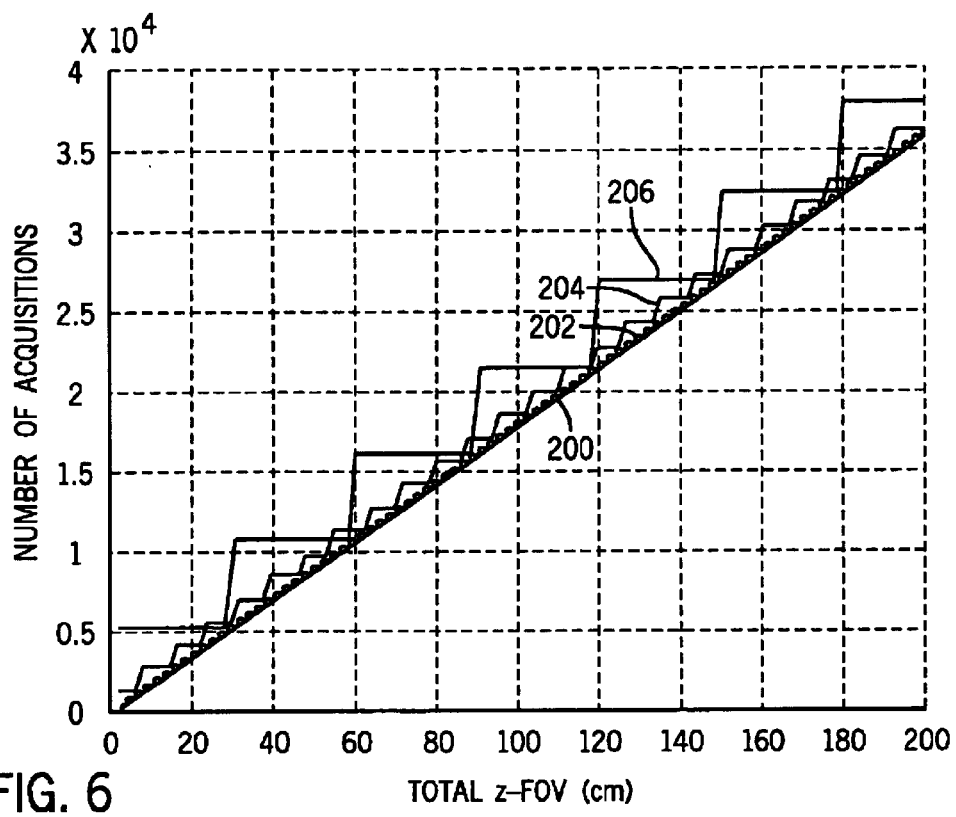
FIG. 6 is a plot of a number of acquisitions versus total z-FOV for four values of slab thickness.
Figure 7:
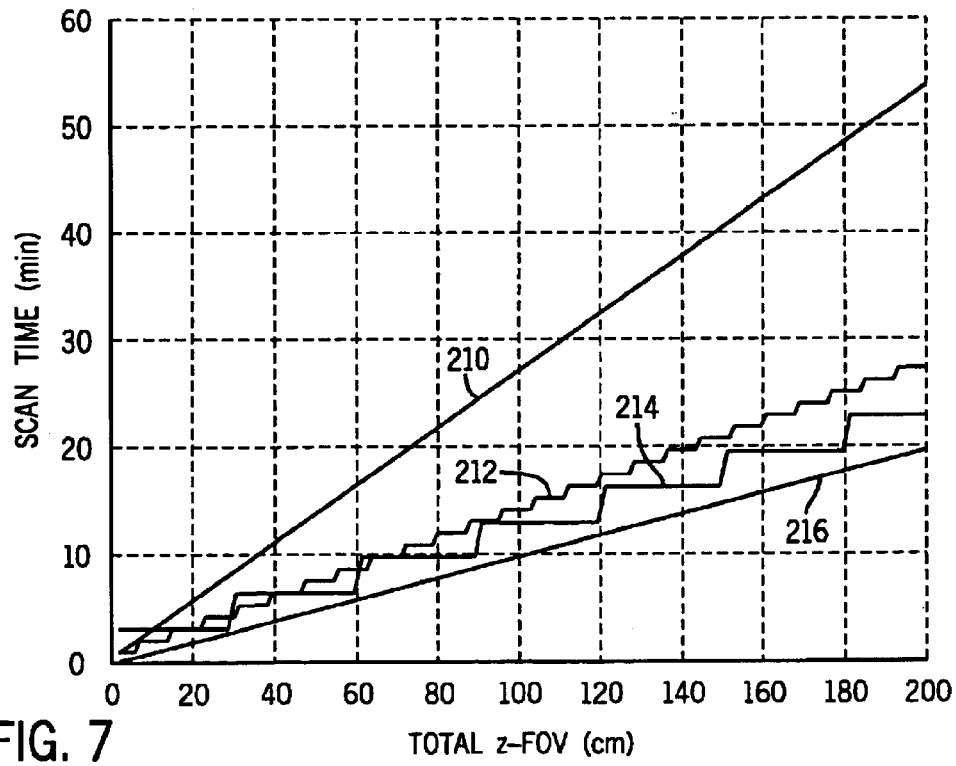
FIG. 7 is a plot of total scan time versus total z-FOV for the four values of slab thickness plotted in FIG. 6.

FIG. 6 is a graph plotting a number of acquisitions versus total FOV in the direction of table motion for three values of slab thickness and a single acquisition. In this exemplary acquisition having 18 transverse magnetic field gradient subsets and 1 mm resolution in the direction of table motion, the baseline 200 represents a single acquisition (i.e., no table movement), with the entire FOV acquired as a single large volume. The rippled line 202 shows the acquisition for a 1.8 cm slab, while the next plot 204 shows that for an 8 cm slab, and the largest stepped plot 206 is that for a 30 cm slab. Referring to FIG. 7, the total scan time for each of the acquisitions of FIG. 6 are shown plotted against total FOV in the direction of table motion in centimeters. Plot 210 corresponds to the 1.8 cm. slab acquisition, which took the longest total scan time because of the many table movements, while plot 216 is that of the single acquisition, which was the fastest. Between plots 210 and 216, the acquisition times for the 8 cm slab are shown by plot 212 and the 30 cm slab by plot 214. Each of these acquisitions assumes 32 ms for each repetition of excitation plus acquisition of encoded data and one-second for each table movement. In this example, where the time to initiate table motion is long relative to the time required for a single acquisition, it is evident that the larger the slab thickness, the faster the scan times that can be achieved since fewer table motions are required.

In another embodiment, the present invention includes a process and system suitable for use with the MRI system of FIG. 1, or any similar or equivalent system, for obtaining MR images using frequency encoding in a direction parallel to continuous table motion, typically defined as the z-direction. Continuously moving the patient table allows for data acquisition at different table positions along the desired FOV with reduced scan time requirements. Collecting images while continuously moving the patient table and placing the frequency encoding axis in the direction of table motion has a number of advantages including the acquisition of images with FOV larger than the optimal imaging volume of the MR system, final reconstructed images that do not exhibit slab boundary artifacts, and less time associated with moving the patient table through the imaging volume. The present invention also allows for varying the repetition interval of excitation, gradient waveforms, and acquisitions with velocity. Further, any trajectory in the transverse k-space dimension(s) may be used. For example, for a 3D acquisition, the phase encodes could be positioned in the transverse k-space plane in the shape of a spiral, in concentric rings, in rays from the center, or in a Cartesian grid. For all positions other than the Cartesian grid, gridding of the data in the transverse plane occurs before performing the 2D Fourier transform.

Moreover, the present invention allows for acquisition of slightly over half of the full k-space data in the transverse dimension(s) with reconstruction using homodyne processing. Further, slightly over half of the full k-space data may be acquired in the readout direction, i.e., frequency encoded direction, which is in the direction of table motion. In addition, phase encodes in the transverse k-space dimension(s) may be acquired in any temporal order and/or with different temporal frequencies. For example, phase encodes closest to the k-space origin could be acquired with a higher temporal frequency than the, phase encodes further from the k-space origin. Furthermore, a subset of phase encodes may be acquired during movement of the table over the FOV during forward movement of the patient table and then acquiring a different subset of phase encodes in the same FOV during reverse table direction. For example, low spatial frequency k-space lines may be acquired during a first pass over the FOV to acquire one time point of time-varying contrast and then acquire remaining phase encoding lines while the patient table is continuously moved back over the FOV.

Additionally, the present invention allows for acquisition of MR data for a larger slab thickness in the direction of continuous table motion than is used for image reconstruction. The data corresponding to the extra slab thickness may be selected so that data on subsequent repetitions of the same phase encoding would have overlapping coverage in the direction of table motion. This overlapping data may be used to estimate table velocity and position and/or other correction factors. Further, this overlapping data may be acquired using the same polarity of readout gradient or an opposite polarity. It may also have the same or different echo time. Data for the extra slab thickness may be acquired for all phase encodes or only the phase encode at the origin of the k-space in the transverse dimension(s). The acquired MR data may also be used for creating an image as well as for estimating correction factors, or may be used as an extra acquisition that is used to estimate the correction factors. For example, MR data corresponding to the $k_x=k_y=0$ line may be acquired with double the imaging slab thickness for each repetition of the full set of waveforms. From that, change in table position may be determined by performing a cross-correlation.

The present invention also enables the use of less data than acquired in the direction of table motion thereby allowing the dropping of data at a leading and a trailing edge of acquisition to combat imperfections in filtering. Estimations of imperfections in the magnetic field and center frequency induced by the magnet alone may be determined before starting table motion. Despite continuous table motion, these imperfections will be fixed relative to the magnet. Imperfections induced by object-dependent susceptibility will be superimposed on these fixed errors. The present invention is applicable with any type of image contrast including proton density, T1 weighted, T2 weighted, phase contrast, and SFFP type sequences. Saturation bands may be applied superior and/or inferior to the imaging slab to suppress inflowing blood from one or both directions or to create a different unique contrast effect. Further, the present invention allows for application of echo-planar type readouts in the direction of table motion to acquire different lines in k-space or, depending upon the application, reacquire the same k-space line. Such data may be used for image formation or it may be used to determine correction factors and/or table positions/velocity. If different k-space lines are acquired, the acquisition order may be linear or interleaved. The present invention also allows for correcting gradient non-linearities in a direction of table motion on each acquired line and for transverse gradient non-linearities by correcting each $k_x$-$k_y$ location individually based on the gradient non-linearity at the table location at the time of acquisition.

As is known and previously stated, in any MRI system, there is a limited spatial volume having optimal gradient linearity, uniform magnetic polarizing field $B_0$, and uniform RF homogeneity. Larger volumes are traditionally imaged in sections with table motion between scans that result in concatenated images that exhibit discontinuities at slab junctions. The present invention includes an imaging technique that moves the table position continuously during the scanning procedure to create large FOV images without slab boundary artifacts and without adding scan time for table motion between fixed-location acquisitions. Acquired images can be 2D single-slice, 2D multi-slice, 2D projection, or 3D.

In general, after defining the desired FOV, a slab thickness is selected to remain within the MRI system's optimal imaging volume. As a result, the slab thickness is also smaller than the desired spatial coverage. MR data is acquired by repeatedly applying an excitation that excites spins and applying magnetic field gradient waveforms to encode the volume of interest. Preferably, the spatial extent of the acquired data is restricted in the direction of motion using applied magnet field gradient waveforms that allow the acquisition filter to restrict the slab thickness. The FOV can be restricted using spatially-selective RF pulses in directions perpendicular to the direction of table motion. In the examples shown and in one preferred embodiment, the direction of continuous table motion is in the z-direction. However, as one skilled in the art will readily recognize, the x-y-z orientation is somewhat arbitrary and the invention is therefore not so limited. In addition, in the example shown and in a preferred embodiment the table moves relative to the system. However, as one skilled in the art will readily recognize it is equivalent to have the system move relative to the subject and the invention is accordingly not so limited.

The table is moved to cover the desired FOV while the slab position remains fixed relative to the magnet in the MRI system. During each acquisition, full k-space data representing the selected slab in the direction of table motion is acquired for a subset of the data in the other dimension(s) by using one or a series of magnetic field gradient waveforms.

Figure 8:
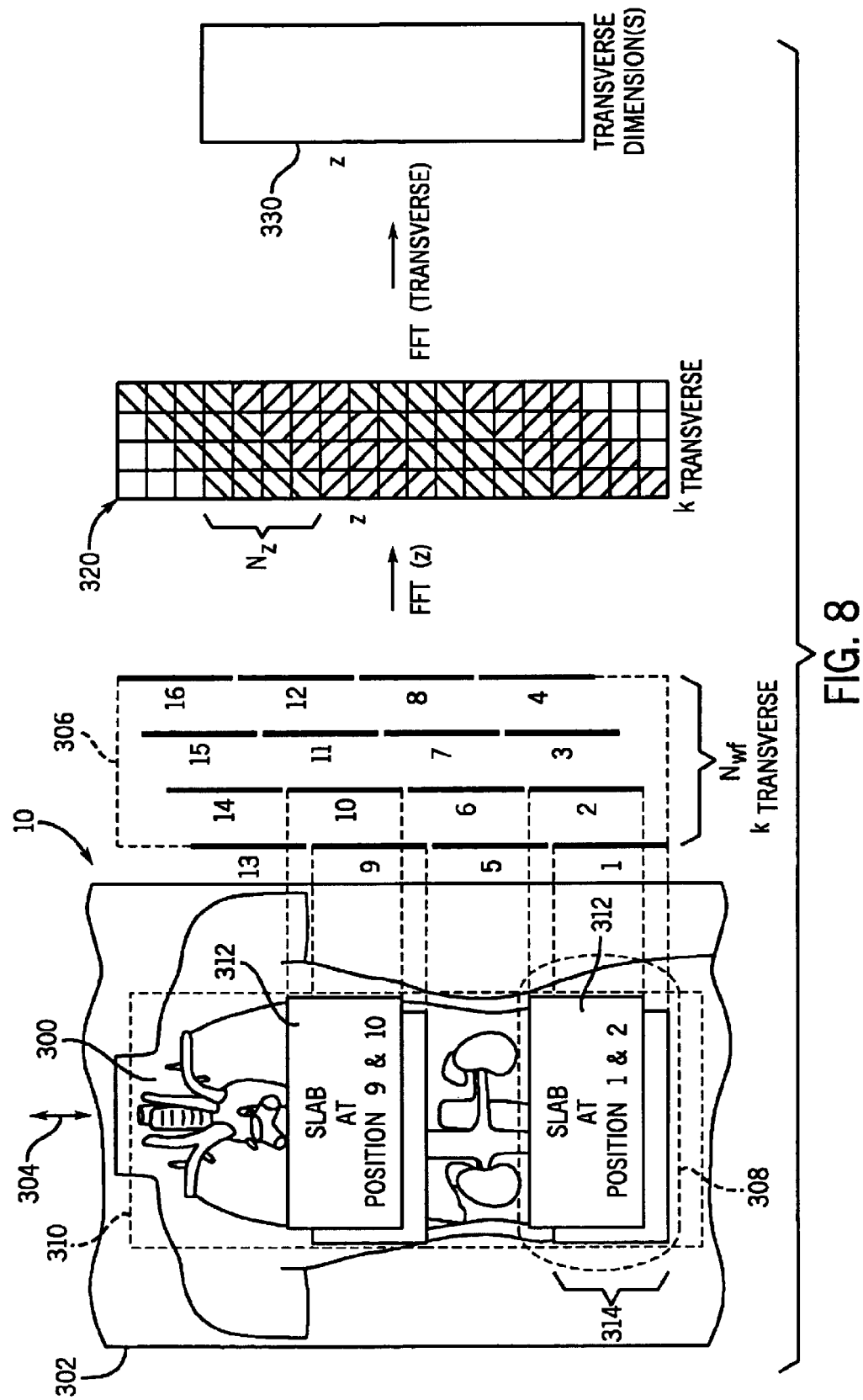
FIG. 8 is a diagram illustrating another embodiment of a data acquisition technique in accordance with the invention.

Referring to FIG. 8, the basic concepts of a data acquisition and processing technique, in accordance with this embodiment of the present invention, is shown schematically. FIG. 8 illustrates one embodiment of the present invention for acquiring data. In this embodiment, the table is moved continuously with 16 exemplary data acquisitions 306 at different table positions along the desired FOV. The table position and/or velocity at each acquisition is measured or estimated. A patient 300 is positioned on a moveable table 302, which moves fore and aft 304 within the MRI scanner 10 with respect to the magnet and the optimal imaging area 308 of the MRI scanner. The desired FOV 310 is substantially larger than the optimal imaging area 308, which is generally larger than a selected slab thickness 312. As previously discussed, the table motion in this simplified example is in the z direction. Magnetic field gradient waveforms are designed to encode the full $k_z$ data for four k-space positions or subsets in the transverse dimension(s) ($N_{wf}$=4). During each data acquisition 1–16, four $k_z$ levels are encoded that result in four z- pixels in the excited slab after Fourier transformation in the z direction ($N_z$=4). $N_z$ and the slab thickness may be reduced after acquisition if data at the edges of the acquisition are dropped to minimize the effect of imperfections in the filter or for other reasons to be discussed below. It is understood that the optimal imaging area 308 is defined by the physical characteristics of the MRI system 10. It is preferred to define a volume of interest, or slab, 312 to be within the optimal imaging area 308.

Any of the aforementioned parameters can be adjusted as desired. That is, the slab thickness 314 may be made larger or smaller and the number of data acquisitions 306 can be increased or decreased, above or below the 16 that are shown. The maximum table velocity is determined by the slab thickness divided by the time required to collect all the data corresponding to one cycle through the set of gradient waveforms. Additionally, the number of z-pixels, $N_z$, retained in each excited slab, as well as the number of gradient waveforms in a set, $N_{wf}$, can be modified as desired.

Still referring to FIG. 8, it is noted that each acquisition position 1–16, includes complete sampling in the direction of table motion which in this case is the z-direction, for a subset of the data in the direction(s) perpendicular to the direction of table motion. Accordingly, either after each acquisition, or after all the data is acquired for a complete image, the data is Fourier transformed in the direction of table motion, in this case in the z direction (FFT(z)), to form an array of z-$k_{transverse}$ data 320. The patient table 302 is moved continuously until the entire FOV 310 is covered. As indicated, at each acquisition position, full z-encoding data, or frequency encoding data in the direction of table motion, is acquired for a subset of the desired transverse k-space positions, which are in the one or two directions perpendicular to the table motion.

After Fourier transforming with respect to z, or the direction of table motion, data acquired at different table positions are then sorted and aligned to match anatomic z locations, thereby filling the z-$k_{transverse}$ space. Data can be interpolated as necessary to improve the accuracy of the alignment. As previously indicated, after the acquired data are Fourier transformed with respect to z, data at the slab edges can be dropped as required by imperfections in filter performance or for other reasons as described below. A final reconstructed image 330 is formed by gridding and/or performing other processing as necessary, and Fourier transforming the fully sampled data array 320 in remaining dimension(s).

It is noted that the subsets of magnetic field gradient waveforms, ($g_x$ $g_y$, $g_z$) are defined by one or a series of such waveforms that differ between subsets. This set, or series, of magnetic field gradient waveforms, that encode the $k_{transverse}$ subsets, are then repeated in a cyclic manner to obtain the data sets 306, FIG. 8.

The present technique can be used with any 2D or 3D k-space trajectory that is uniform in the direction of table motion. For example, a 2D or 3D acquisition could be performed with the frequency-encoding axis in the direction of table motion and phase encoding gradients positioned on a Cartesian grid in the k-space dimension(s) that are perpendicular to the direction of table motion. Phase encoding gradients for a 3D acquisition could also be positioned on concentric circles, in the shape of a spiral, in rays from the center of k-space, or in any other pattern. In a 2D or 3D acquisition, phase encoding gradients could be placed in a pattern with density that varies with k-space position. If a non-Cartesian and/or non-uniform placement of $k_{transverse}$ locations is utilized, the data would be gridded in the transverse dimension(s) during reconstruction.

Partial k-space techniques could be employed. For partial k-space in the transverse direction(s), slightly more than half of the data is acquired in the transverse direction. Homodyne processing would then be utilized in the reconstruction. Partial k-space techniques could also be used in the direction of table motion. Homodyne processing could also be used in this case.

Echo-planar type acquisitions could be employed with readout in the direction of table motion. This would allow full k-space data in the direction of table motion to be acquired for multiple transverse k-space positions following each RF excitation. Alternatively, full k-space data in the direction of table motion could be acquired multiple times for the same transverse k-space position following a single RF excitation. Such data acquisition could allow for the calculation of image correction factors.

Different k-space locations in the transverse dimension(s) may also be acquired with different slab thicknesses in the direction of table motion and therefore could be acquired with different temporal frequency during table motion.

As another variation, k-space locations in the transverse dimension(s) can be acquired in a variety of orders to achieve different modulations of k-space or different contrast properties. K-space locations in the transverse dimension(s) may be acquired sequentially from one edge of k-space to the other, centrically from the center out, in an interleaved fashion, or in any other pattern that is desired.

K-space locations in the transverse dimension(s) could also be divided into an arbitrary number of subsets that could be acquired in multiple table passages. For example, you could acquire the $k_{transverse}$ data in two stages. First, you could acquire the $k_{transverse}$ locations within a certain radius of the center of k-space. Since less time would be required to acquire this subset of the required data, the table could move faster over the selected FOV. As an example application, this would allow the center of k-space, which has the largest impact on image contrast, to be acquired at the point of optimal contrast following administration of an extrinsic MR contrast agent. The table would then be moved back over the same FOV again to acquire higher spatial frequency k-space data.

As another extension, data for a larger selected slab thickness could be acquired in the direction of table motion. The extra data could be acquired for all transverse k-space positions or only some positions, for example the $k_x=k_y=0$ line. The extra slab thickness could be selected such that the acquired data on subsequent repetitions of the same gradient waveform set would acquire data from overlapping spatial regions. This overlapping data could be used to estimate the distance of table motion between the two acquisitions or could be used to estimate other image correction factors. A portion of the data from these acquisitions with the increased slab thickness could be used to reconstruct the image in the normal fashion described in FIG. 8 or these acquisitions could be extra acquisitions that are interspersed between the standard acquisitions in the imaging experiment. The acquisitions with overlapping data could have identical imaging parameters or could have different echo times or readout gradients.

Since k-space data for a single anatomic location in the direction of table motion is compiled from data collected at different table positions, any variation in phase or amplitude in the direction of table motion will result in image artifacts. To minimize such artifacts, frequency variations in the direction of table motion that result from magnetic field inhomogeneity are demodulated during reconstruction. Frequency variations induced by the applied external magnetic field may be estimated before table motion begins. Gradient non-linearities can be corrected by assuming that these imperfections are separable between the direction of table motion and the transverse dimension(s). Gradient non-linearities in the direction of table motion are corrected for each data acquisition. Transverse non-linearities are corrected using a different factor for each transverse k-space location, or group of locations, that is/are determined using knowledge of the table position at the time of data acquisition. Signal phase induced by table motion during acquisition may be corrected during reconstruction.

Figure 9:
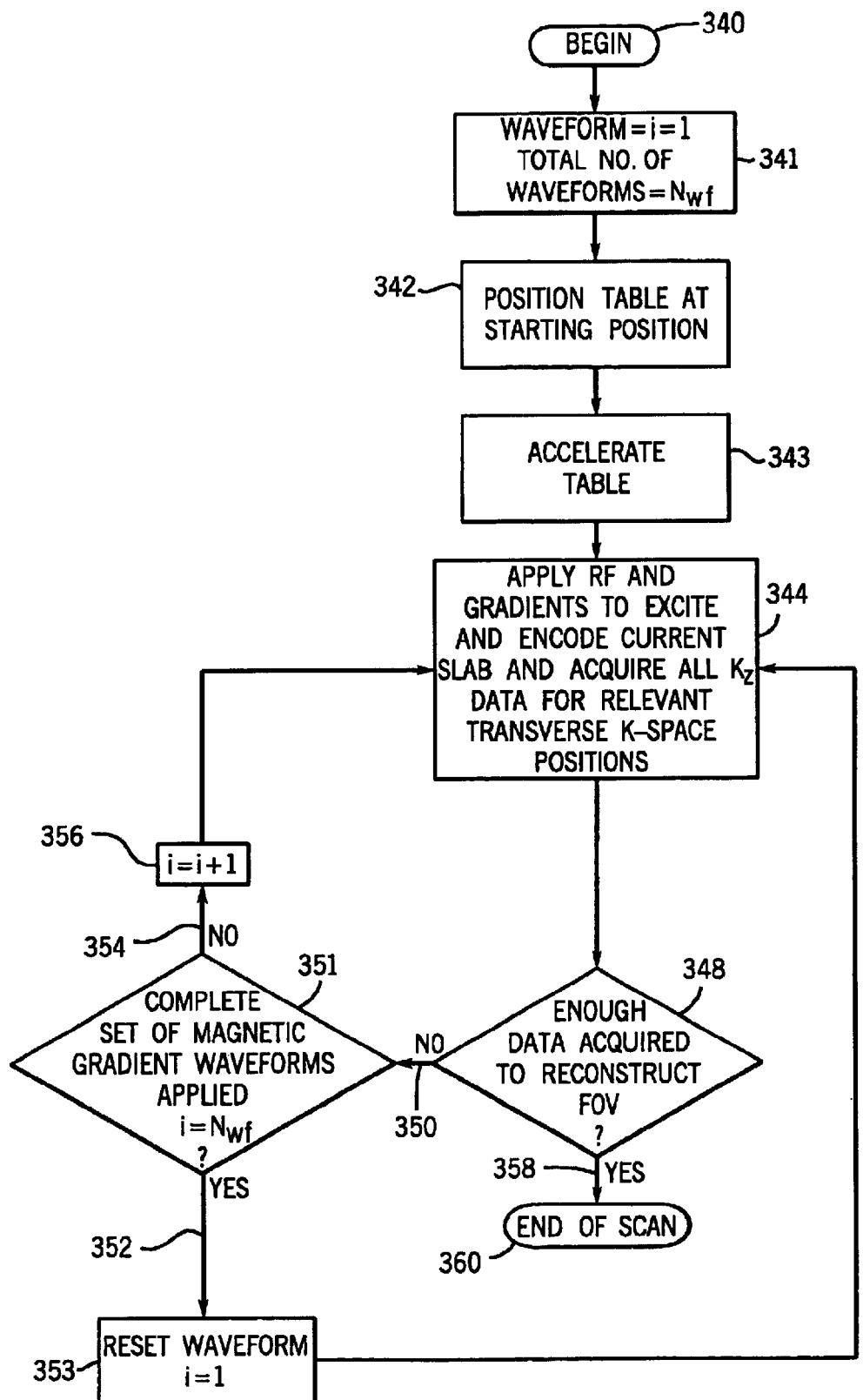
FIG. 9 is a flow chart demonstrating a data acquisition algorithm for use with that shown in FIG. 8.

FIG. 9 is a flow chart for a data acquisition sequence in accordance with the technique of FIG. 8. After the data acquisition sequence is initialized 340, selecting the $1^{st}$ gradient waveform for each gradient axis (x, y, and z) occurs at 341. The variable i represents the selected waveform for each axis. The table is positioned at a location superior or inferior to the desired FOV. In the preferred embodiment, this starting position is selected at 342 to allow the table to accelerate at 343 to the desired constant velocity before the leading edge of the desired FOV is reached. Alternatively, the starting position could be selected near the initial position requiring data to be acquired and the change in table velocity during acceleration could be accounted for in the data processing. MR data is acquired by repeatedly exciting spins using an RF pulse and applying magnetic field gradient waveforms to encode the volume of interest 344. All RF and gradient waveforms would be played out even if data is not acquired during table acceleration to establish the steady-state MR signal levels. Assuming table motion in the z-direction, each acquisition would ensure all $k_z$ data are acquired for the selected transverse k-space position(s), that is in the dimension(s) perpendicular to table motion ($k_x$ and/or $k_y$). The table position and/or velocity is measured or estimated and recorded for the time of data acquisition. The spatial extent represented by the data in the direction of table motion is limited by acquiring data in such a way that the acquisition filter can be used to restrict the slab thickness. A determination is then made at 348 to determine if sufficient data to reconstruct the desired FOV has been acquired. As long as sufficient data to reconstruct the desired FOV has not been acquired 348, 350, the system checks whether a complete set of magnetic gradient field waveforms has been applied (I=$N_{wf}$?) 351. If a complete set of magnet gradient field waveforms have been applied 351, 352, the system again selects the $1^{st}$ waveform on each axis at 353 and the cycle begins anew at 344. If not, the system increments to the next gradient waveform 356 and data is acquired for the current slab position as the table continues to move 344. This process is repeated until all the slabs have been scanned across the FOV 358, which completes the scan 360. Again, the direction of table motion is arbitrarily chosen and represented as a z-direction. However, the invention is not so limited. As one will readily recognize, the assignment of any character set can be used to represent a three dimensional axis.

It is noted that at each data acquisition position such as the acquisition at position 1 in FIG. 8, unique magnetic gradient waveforms or a set of waveforms on the gradient axis perpendicular to the direction of table motion (transverse waveforms) are applied in conjunction with the gradient waveform or waveforms required to acquire a complete set of data in the direction of table motion. At positions 2, 3, and 4, different magnetic gradient field waveforms or sets of waveforms are applied on the axis perpendicular to the direction of table motion. The waveform on the axis parallel to the direction of table motion can be the same for each set or can also vary. The next series of acquisition positions, 5–8, FIG. 8, use the same magnetic field gradient waveforms as in the data acquisitions 14. Therefore, the variable i is used in FIG. 9 to increment the application of the proper magnetic field gradient waveforms for the series, and when a series is complete, the same waveforms are recycled in the next series.

Figure 10:
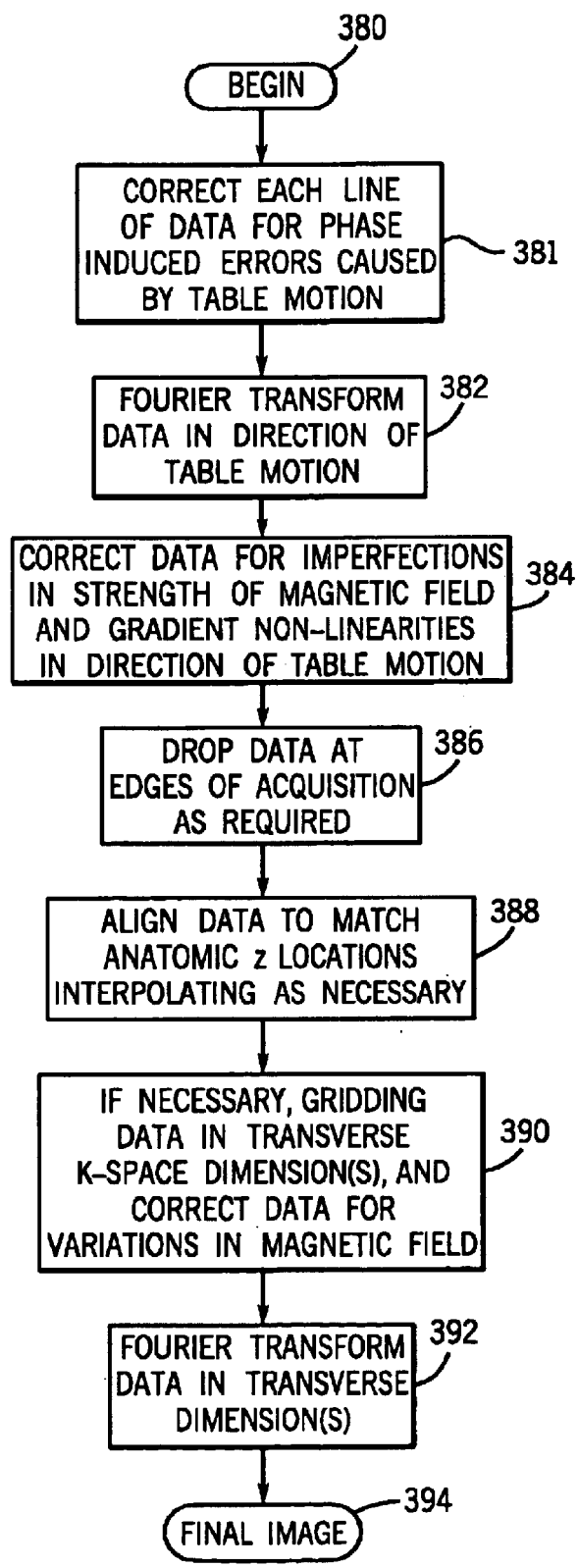
FIG. 10 is a flow chart showing the data processing steps employed either during or after the data acquisition of FIG. 9.

Referring now to FIG. 10, a data processing scheme in accordance with one embodiment of the present invention is shown in flow chart form. Once initiated 380, which can either be as data is being acquired on-the-fly, or after all data has been acquired, the MR data is corrected for phase inducements caused by the table motion 381. It is then Fourier transformed in the direction of table motion, z in this case, at 382, and if necessary, the data is corrected for imperfections in the magnetic field and gradient non-linearities in that direction 384. After Fourier transformation, the data at the edge boundaries of the slab and/or extra data are discarded as required 386. Either after or during the Fourier tranform, the data is aligned to match anatomic locations at 388, interpolating as necessary. Then, some, all, or none of the following additional processing steps are performed as required by the specifics of the imaging procedure: the data may be gridded in the transverse dimension(s), corrected for shim errors in the transverse direction(s), homodyne processed in the transverse direction(s), and/or corrected for gradient non-linearities in the transverse dimension(s) at 390. The data is then Fourier transformed in the transverse dimension(s) at 392 to reconstruct the final image 394.

Figure 11:
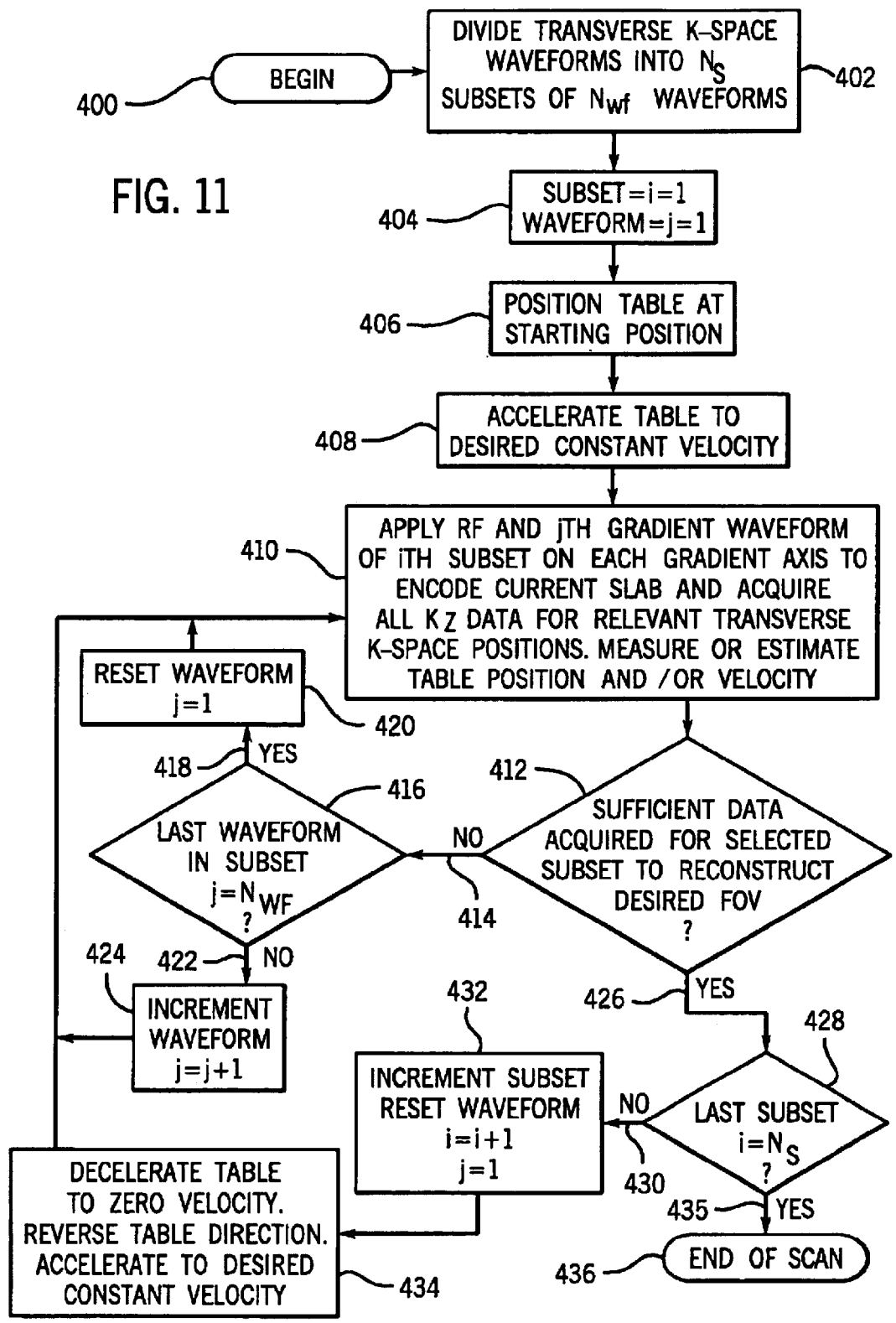
FIG. 11 is a flow chart representing a data acquisition algorithm in accordance with an alternate embodiment of the invention.

Referring to FIG. 11, the steps of another embodiment of the present invention are shown in flow chart form. After the data acquisition sequence is initialized 400, the transverse k-space waveforms are divided into $N_s$ subsets of $N_{wf}$ 402. Subsets may be formed with unequal numbers of waveforms, but for this simplified example each subset has an equal number of waveforms, $N_{wf}$. The first waveform of the first subset is then selected at 404. The patient table is then positioned at a starting location 406 such that the table is allowed to accelerate to the desired constant velocity at 408 before the leading edge of the desired FOV is reached. MR data is then acquired by repeatedly exciting spins using an RF pulse and applying the Jth gradient waveform of the Ith subset on each gradient axis to encode the current slab and acquire all k, data for the relevant transverse k-space positions at 410. At 412, the process determines if sufficient data has been acquired for the selected subset to reconstruct desired FOV 412. If not 412, 414, the process determines at 416 if the complete set of magnetic gradient waveforms have been applied (J=$N_{wf}$. If so 416, 418, the process again selects the first waveform on each axis at 420 and the cycle begins anew at 410. If not 416, 422, the process increments to the next gradient waveform 424 and data is acquired for the current slab position. This process is repeated until all slabs have been scanned across the FOV, which completes the scan in a first or forward direction.

If at 412, the process determines that there is sufficient data acquired for the selected subset to reconstruct the desired FOV 426, the process determines if the last subset has been encoded at 428. If not 428, 430, the process increments the subset and resets the waveform, i.e., J=1 at 432. At 434, the table is decelerated to zero velocity and subsequently reversed and accelerated until a desired constant velocity is reached. An RF and Jth gradient waveform of the I+1 subset on each gradient axis are then applied at 410 while the table moves in a second or reverse direction. If at 428 the last subset has been encoded and sufficient data has been acquired to reconstruct a final image for the desired FOV 435, the scan ends at 436.

Methods such as those described here could be used to acquire images with a variety of contrast properties. As examples, images could display proton-density weighting, T1 weighting, T2 weighting, or any other weighting available in stationary-table imaging. Image contrast could be manipulated by interleaving the repetition of imaging RF and gradient waveforms with RF and gradient waveforms designed to saturate, invert, or otherwise manipulate spins in regions superior or inferior to the selected imaging slab or with specific spectral properties. Such saturation regions could suppress in-flowing materials from the direction saturated, could saturate lipid spins, or could achieve different contrast effects due to the movement of the patient table.

There are a number of advantages associated with the present invention. For example, the present invention allows for 3D imaging with continuous motion and frequency encoding in the direction of the patient and/or patient table motion. Two-dimensional single-slice or multi-slice imaging with continuous motion and frequency encoding in the direction of table motion is also possible. Further, 2D projection with continuous motion and frequency encoding in the direction of motion may be achieved with the present invention. The present invention further allows for different spatial distributions of phase encode positions such as spiral, concentric rings, variable density, etc. and using gridding reconstruction techniques. The present invention further allows for partial k-space imaging methods with continuous table motion as well as different phase encode orderings with continuous table motion. The present invention also enables for tracking of table position using acquired larger slab thickness in a direction of table movement thereby allowing for the overlapping of data. Additionally, the table may be moved several times over a desired anatomy to achieve greater image quality. The present invention also allows for performing off-resonance and gradient linearity correction with moving table as well as using saturation bands with a moving table. EPI readout in a direction of table motion to either reacquire the same k-space line or a different line is possible with the present invention. Further, the present invention allows for different temporal update rates for different phase encode positions.

Accordingly, the present invention includes a method of imaging large volumes without resulting slab-boundary artifacts that includes defining a desired FOV larger than an optimal imaging volume of an MR scanner, selecting a slab thickness in a first direction that is smaller than the desired FOV, but within the optimal imaging volume of the MR scanner, then exciting and encoding spins to acquire data that is restricted to the selected slab thickness. MR data is acquired that includes full encoding data in the direction of table motion for a subset of the remaining direction(s) and continual moving one of the optimal imaging volume and an imaging object to acquire another set of MR data. This process of acquiring sets of MR data and continual moving the table is repeated until the desired FOV is covered. Acquired MR data can be used and analyzed to track motion of the table. In a preferred embodiment, each MR data acquisition includes acquiring all k-space data in the direction of table motion for a selected subset of the remaining transverse dimension(s), and further includes defining a set or series of magnetic field gradient waveforms that encode a k-space trajectory that is uniform in a k-space dimension(s) along the direction of movement.

The invention also includes an MRI apparatus, such as that disclosed with reference to FIG. 1, having a patient table moveable fore and aft in the MRI system within the magnet and a computer programmed to receive input defining a desired FOV larger than an optimal imaging volume of the MRI system. The MRI system comprises a plurality of gradient coils positioned about a bore of a magnet to impress a polarizing magnetic field, and an RF transceiver system and an RF switch controlled by a pulse module to transmit RF signals to an RF coil assembly to acquire MR images. The computer is programmed to define a fixed slab with respect to the magnet to acquire MR data and acquire full MR data using frequency encoding in the direction of table motion for a selected subset of data in the directions perpendicular to the direction of table motion. The patient table is moved while maintaining position of the fixed slab, and the system is further programmed to repeat the acquisition and movement until an MR data set is acquired across the desired FOV that is sufficient to reconstruct an image of the FOV.

Additionally, the present invention also includes a computer program to control a medical image scanner and create images across scanning boundaries without boundary artifacts. The computer program has a set of instructions to control a computer to select an FOV spanning an area greater than a predefined optimal imaging area of the medical image scanner and acquire MR data by repeatedly applying an RF pulse to excite a region in the selected FOV and magnetic field gradients to encode the region in a direction. The instructions further control the computer to apply a k-space trajectory to encode the region in the direction of table motion and acquire data for a subset of the remaining direction(s). The computer program includes instructions to continuously reposition the imaging object with respect to the predefined optimal imaging area or vice versa and repeat the image data acquisition and the continuous imaging area repositioning until complete image data are acquired across the entire FOV to reconstruct an image of the FOV. Positioning of the optimal imaging area can be tracked using acquired MR data, or other known processes.

The present invention results in images that are free of slab-boundary artifacts, reduces the time required for data acquisition, and allows spatial coverage that is limited only by the range of table motion.

The present invention has been described in terms of the preferred embodiment, and it is recognized that equivalents, alternatives, and modifications aside from those expressly stated, are possible and within the scope of the appending claims.

What is claimed is:

1. A method of imaging large volumes without resulting slab-boundary artifacts comprising:

defining a desired FOV larger than an optimal imaging volume of an MR scanner;

selecting a slab thickness in a first direction that is smaller than the desired FOV and within the optimal imaging volume of the MR scanner; and continuously moving one of the optimal imaging volume and an imaging object in the first direction while repeatedly exciting and encoding spins with readout in the first direction to acquire data that is restricted to the selected slab thickness until at least one image of the FOV can be reconstructed;

processing MR data to account for accrued phase resulting from table velocity;

transforming MR data in a z-direction;

correcting the MR data for spatial variations in the magnetic field in the direction of motion;

removing unnecessary data at the beginning and ending of each acquisition; and sorting, interpolating, and aligning the transformed MR data to match anatomic locations in the first direction.

2. The method of claim 1 further comprising reconstructing an MR image by transforming the z-transformed MR data in remaining transverse dimension(s).

3. The method of claim 1 further comprising gridding the z-transformed MR data in dimension(s) perpendicular to the first direction to reconstruct an MR image.

4. The method of claim 1 further comprising the step of using additional MR data to track motion of one of the optimal imaging volume and an imaging object.

5. The method of claim 1 further comprising reconstructing the acquired data to form at least one of a 2D image and a 3D image.

6. The method of claim 1 further comprising the step of using a portion of the acquired MR data to track motion of one of the optimal imaging volume and an imaging object.

7. The method of claim 1 wherein the step of exciting and encoding spins is further defined as restricting data acquisition by encoding and filtering data so as to acquire data that is limited to the selected slab thickness.

8. The method of claim 1 wherein the step of exciting and encoding spins is further defined as restricting excitation in at least one direction other than the first direction.

9. The method of claim 1 wherein the first direction is defined as a z-direction.

10. The method of claim 1 wherein each MR data acquisition during continuous movement includes acquiring all k-space data in a direction of motion of a patient table for a selected subset of transverse k-space data.

11. The method of claim 1 further comprising reducing exam time by imaging during table motion.

12. The method of claim 1 further comprising processing the MR data using a gridding reconstructing.

13. The method of claim 1 further comprising the step of maintaining a position of slab thickness fixed relative to a magnet of the MR scanner during imaging of the desired FOV and the continuous moving of one of the optimal imaging volume and the imaging object.

14. The method of claim 1 further comprising applying gradient waveforms on an axis parallel to the first direction while acquiring imaging data.

15. An MR apparatus to acquire multiple sets of MR data with a moving table and reconstructs MR images without slab-boundary artifacts comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images;
   a patient table movable fore and aft in the MRI system about the magnet bore and
   a computer programmed to:
      receive input defining a desired FOV larger than an optimal imaging volume of the scanner;
      position the patient table at a location superior or inferior to the desired FOV;
      accelerate the patient table to a desired constant velocity before a leading edge of the desired FOV reaches a slab fixed in position with respect to the magnet;
      acquire full MR data with readout in a direction of table motion;
      continuously move the patient table at the desired constant velocity while maintaining position of the fixed slab; and
      repeat acquisition of full MR data for a number of table positions while the patient table is moving until an MR data set is acquired across the desired FOV to reconstruct an image of the FOV.

16. The MRI apparatus of claim 15 wherein the computer is further programmed to cause transmission of magnetic gradient waveforms to encode a k-space trajectory that is uniform in $k_z$.

17. The MRI apparatus of claim 15 wherein the computer is further programmed to:
   transform MR data with respect to z;
   align the z-transformed MR data to match anatomy across slab boundaries; and
   transform the z-transformed MR data with respect to at least one remaining dimension to reconstruct an MR image.

18. The MRI apparatus of claim 15 wherein the computer is further programmed to:
   apply an RF pulse to excite a volume-of-interest;
   apply a k-space trajectory to encode the volume-of-interest; and
   filter the acquired MR data to restrict the MR data to the defined fixed slab.

19. The MRI apparatus of claim 15 wherein the computer is further programmed to:
   acquire all $k_z$ data for a selected subset of transverse k-space data;
   define a set of magnetic field gradient waveforms to incrementally encode and acquire data in a given slab; and
   apply the set of magnetic field gradient waveforms in a cyclic order.

20. A computer program to control a medical image scanner and create images across scanning boundaries without boundary artifacts, the computer program having a set of instructions to control a computer to:
   select an FOV spanning an area greater than a predefined optimal imaging area of the medical image scanner;
   determine a constant velocity by which to continuously translate a patient table about a magnet bore of the medical image scanner;
   position the patient table at a location inferior or superior to the desired FOV;
   accelerate the patient table to the constant velocity before a leading edge of the FOV reaches a slab fixed in position with respect to a magnet of the medical image scanner;
   play out RF and gradient waveforms during patient table acceleration to establish steady-state in the FOV;
   acquire full MR data with readout in a direction of table motion;
   continuously move the patient table at the desired constant velocity while maintaining position of the fixed slab; and
   repeat acquisition of full MR data for a number of table positions while the patient table is moving until an MR data set is acquired across the desired FOV to reconstruct an image of the FOV.

* * * * *